(12) United States Patent
Jacobsen et al.

(10) Patent No.: US 9,129,886 B2
(45) Date of Patent: Sep. 8, 2015

(54) INTEGRATED PIEZOELECTRIC RESONATOR AND ADDITIONAL ACTIVE CIRCUIT

(71) Applicant: TEXAS INSTRUMENTS INCORPORATED, Dallas, TX (US)

(72) Inventors: Stuart M. Jacobsen, Frisco, TX (US); Sridhar Ramaswamy, Plano, TX (US); William Robert Krenik, Garland, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 247 days.

(21) Appl. No.: 13/670,735

(22) Filed: Nov. 7, 2012

(65) Prior Publication Data
US 2014/0125198 A1    May 8, 2014

(51) Int. Cl.
| | |
|---|---|
| H01L 41/02 | (2006.01) |
| H01L 27/20 | (2006.01) |
| H03H 9/05 | (2006.01) |
| H03H 9/17 | (2006.01) |

(52) U.S. Cl.
CPC .............. *H01L 27/20* (2013.01); *H03H 9/0542* (2013.01); *H03H 9/175* (2013.01)

(58) Field of Classification Search
CPC ...... H04R 17/00; G10K 11/002; H03H 9/177; H03H 9/0207; H03H 9/24; H01L 41/0926
USPC .......................................... 310/314, 320, 321
See application file for complete search history.

(56) References Cited

U.S. PATENT DOCUMENTS

| | | | |
|---|---|---|---|
| 7,463,118 B2 | 12/2008 | Jacobsen | |
| 8,558,328 B2 | 10/2013 | Legat et al. | |
| 2002/0036546 A1* | 3/2002 | Hatanaka et al. | 331/68 |
| 2005/0231140 A1* | 10/2005 | Kataoka | 318/114 |
| 2009/0064785 A1 | 3/2009 | Fukuda et al. | |
| 2009/0152983 A1* | 6/2009 | Sinha et al. | 310/314 |
| 2009/0224635 A1* | 9/2009 | Shimodaira | 310/348 |
| 2009/0261416 A1 | 10/2009 | Raberg et al. | |
| 2010/0134209 A1* | 6/2010 | Gabl | 333/187 |
| 2011/0228505 A1* | 9/2011 | Chiba | 361/808 |
| 2012/0086446 A1 | 4/2012 | Shaeffer et al. | |

* cited by examiner

*Primary Examiner* — Derek Rosenau
*Assistant Examiner* — Bryan Gordon
(74) *Attorney, Agent, or Firm* — Jacqueline J. Garner; Frank D. Cimino

(57) ABSTRACT

A semiconductor device comprises a semiconductor wafer; a piezoelectric resonator formed on the wafer, and an active circuit also formed on the wafer. The active circuit (e.g., a frequency divider) is electrically connected to the piezoelectric resonator.

6 Claims, 2 Drawing Sheets

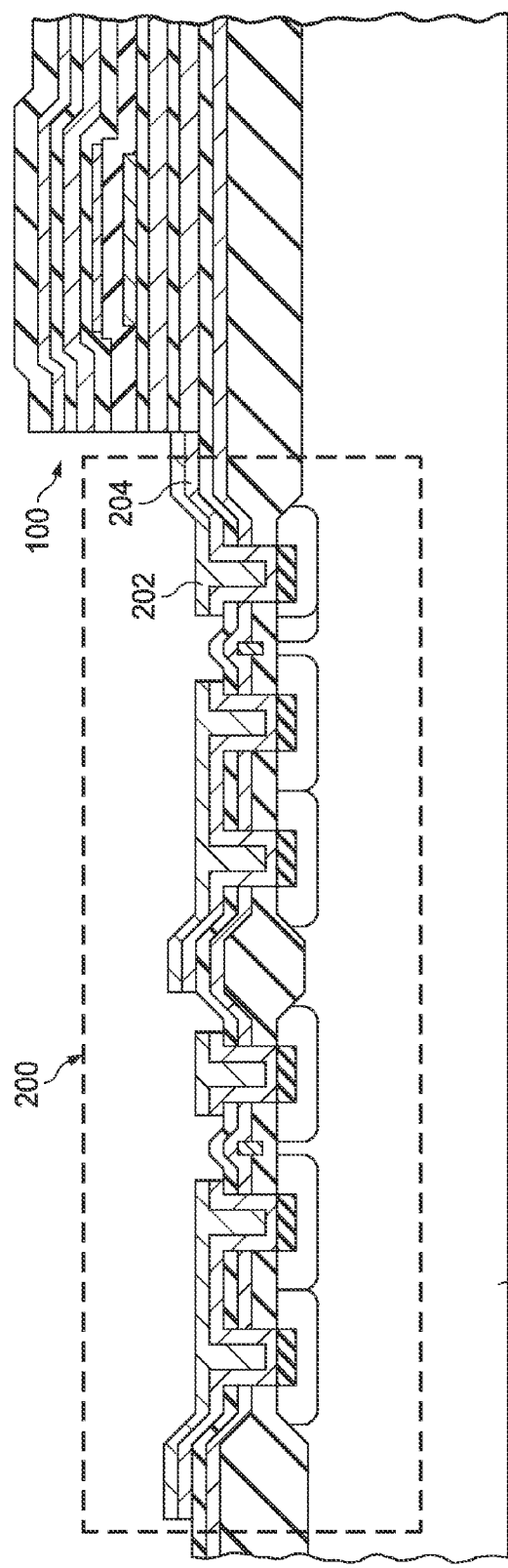
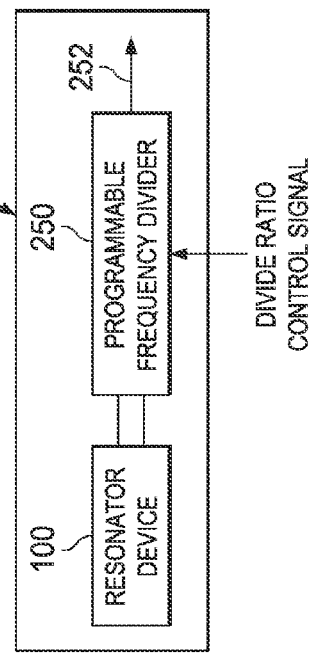
FIG. 2
FIG. 3

INTEGRATED PIEZOELECTRIC RESONATOR AND ADDITIONAL ACTIVE CIRCUIT

CROSS-REFERENCE TO RELATED APPLICATION

None.

BACKGROUND

Timing solutions are important in modern electronics. Used in almost all commercial and consumer equipment, timing devices provide frequency control and timing for many applications. Crystal oscillators have been the predominant type of frequency generators for decades. Crystal oscillators typically use a piece of quartz which results in a fairly large device compared to the integrated circuits the crystal oscillator may be used to control.

SUMMARY

In accordance with various embodiments, a semiconductor device comprises a semiconductor wafer; a piezoelectric resonator formed on the wafer, and an active circuit also formed on the wafer. The active circuit (e.g., a frequency divider) is electrically connected to the piezoelectric resonator.

BRIEF DESCRIPTION OF THE DRAWINGS

For a detailed description of exemplary embodiments of the invention, reference will now be made to the accompanying drawings in which:

FIG. 2 shows a piezoelectric resonator device integrated on the same semiconductor wafer as another active circuit; and FIG. 3 illustrates a system diagram of piezoelectric resonator device and a frequency divider formed on a common semiconductor wafer.

NOTATION AND NOMENCLATURE

Figure 1:
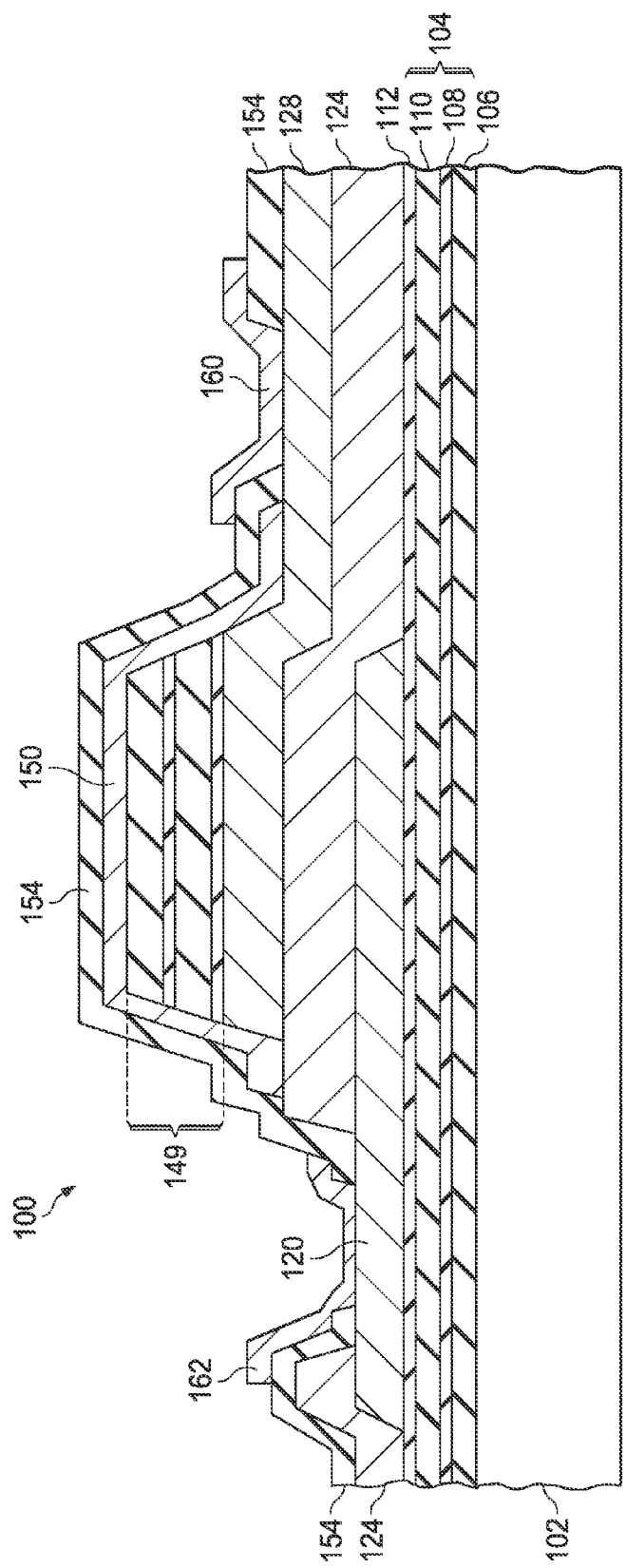
FIG. 1 shows a piezoelectric resonator device.

Certain terms are used throughout the following description and claims to refer to particular system components. As one skilled in the art will appreciate, companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct electrical connection. Thus, if a first device couples to a second device, that connection may be through a direct connection, or through an indirect connection via other devices and connections.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The preferred embodiments of the invention described herein are directed to a piezoelectric-based resonator device that is formed on a semiconductor wafer along with another active circuit such as a frequency divider. By implementing a piezoelectric-based resonator device in silicon and also integrating another circuit on the same wafer, a small compact system can be provided.

FIG. 1 illustrates a cross-section of a piezoelectric resonator device 100 that includes a suitable substrate such as a single crystal silicon wafer 102. On the substrate, an acoustic reflector 104 (such as an acoustic Bragg reflector) preferably is formed. The acoustic Bragg reflector 104 may comprise alternating layers of higher acoustic impedance and lower acoustic impedance.

In the example of FIG. 1, a first layer 106 of high acoustic impedance material is deposited followed by a subsequent layer 108 of low acoustic impedance material. Additional layers 110 and 112 of high and low acoustic impedance material, respectively, are also deposited. Thus, layers 106 and 110 are high acoustic impedance material, and preferably the same material. Similarly, layers 108 and 112 are low acoustic impedance material, and preferably the same material.

In one example, the lower acoustic impedance material may be a dielectric such as nanoporous spin-on-glasses of nano-porous hydrogensilsesquioxane (HSQ) or nano-porous methyl silsesquioxane (MSQ) which may be deposited in a spin coater with a subsequent curing step.

The higher acoustic impedance material may be a dielectric such as comprise silicon carbide (SIC). If SiC is used as the higher impedance material, it may be deposited, in one example, in a plasma chemical vapor deposition (CVD) deposition chamber using source gases such as a mixture of methane ($CH_4$) and silane. If diamond-like-carbon (DLC) or Si-DLC is used, instead of SiC, then a modified deposition chamber is employed. DLC is deposited, for example, in a 150 mm parallel plate reactor RFCVD chamber with the upper plate being the gas distribution source and the lower plate being the cathode on which the substrate lies. In this configuration, the upper plate is positive and the cathode is negative (grounded). An RF source (e.g., 13.56 MHz) may be coupled directly to the substrate through the cathode. After the chamber is evacuated, any hydrocarbon gas, such as $CH_4$, and/or a Si containing hydrocarbon forming gas if Si-doping is required (e.g., tetramethyidisiloxane (4MS)), is introduced into the chamber until the desired pressure is achieved and flow is stable. Other gases such as argon (Ar) and hydrogen ($H_2$) can be used in addition to the hydrocarbon forming gases to control the chemical composition of the final DLC film. At this point power is delivered to the cathode to strike a plasma and DLC is deposited for a fixed amount of time until the desired thickness is achieved. Next the power is shut off and the chamber is vented using an inert gas (Ar, $N_2$, etc.) until ambient pressure is reached and the DLC deposited substrate is removed. Variables that affect DLC physical properties may include: RF power, pressure, total gas flow, different gas ratios and cathode to upper plate spacing. Prior to DLC deposition, an argon plasma may be used to pre-condition the substrate surface for the deposition for 1-2 minutes. DLC deposition may be done at ambient temperatures. DLC thickness and the index of refraction can be measured directly using, for example, a pre-calibrated ellipsometer.

In one example, the thickness of the individual layers of the acoustic Bragg reflector 104 is chosen to be equal to onequarter wavelength of the resonant frequency of the device. Once the acoustic Bragg reflector 104 is complete the next step is to deposit the first resonator electrode 120. In one embodiment, the resonator electrode 120 is sputter deposited, and the material for the electrode is molybdenum (Mo), although other materials are possible as well such as titanium (Ti), tungsten (W), gold (Au), platinum (Pt) or aluminum (Al). In one example, the material for the resonator electrode may have a low thermoelastic loss and may have a thickness of less than about 1000 A in order to maintain a smooth surface.

After the first resonator electrode 120 has been deposited, a piezoelectric layer 124 is deposited. A suitable material for the piezoelectric layer 124 can be aluminum nitride (AlN) although other materials are possible as well such as zinc oxide (ZnO) and lead zirconate titanate (PZT). In one example the AlN layer is reactively sputter deposited with nitrogen gas using an optimized process yielding a low stress, dense layer with a c-axis orientation. The thickness of the piezoelectric layer 124 may be in the range from about 0.1 to about 10 microns.

An upper electrode 128 is deposited to complete the resonator. Again, the top electrode may be a sputter deposited layer of Mo. A top Bragg reflector 149 is also included and is the same or similar in construction to the lower Bragg reflector 104. Contact pads 160 and 162 are provided for external connection to the device. Contact pad 160 provides electrical contact to the upper electrode 128, and contact pad 162 provides electrical contact to the lower electrode 128. The piezoelectric resonator device 100 may have a heater layer 150 and a protective overcoat 154 such as silicon nitride or silicon oxide.

In accordance with preferred embodiments, the piezoelectric resonator device 100 is integrated on a common semiconductor wafer as at least one other active device. Such other active device may be any suitable type of device such as frequency divider. FIG. 2 illustrates a semiconductor wafer 225 on which a piezoelectric resonator device 100 and another active device 200 are formed. Electrical connections from the piezoelectric resonator device 100 and the other active device 200 are provided via conductive pathways 202 and 204.

FIG. 3 illustrates an embodiment in which a piezoelectric resonator device 100 is integrated on the same semiconductor wafer 225 as a frequency divider 250. The frequency divider 250 receives signals from the resonator device 100 and generates a lower frequency in accordance one or more passive external components (e.g., capacitor, resistor, etc.) coupled to the divider via a connection 252. The frequency divider 250 may be programmable via a divide ratio control signal as shown. That state of that control signal causes the frequency divider to divide down the signal from the resonator device by a ratio encoded on the control signal. The control signal therefore permits the output frequency to be programmable as desired. Additional or different active circuits can be integrated onto the same semiconductor wafer 225 as the piezoelectric resonator device 100.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A semiconductor device, comprising:
   a semiconductor wafer;
   a piezoelectric resonator formed on a first portion of said wafer, the piezoelectric resonator having a first electrode, a piezoelectric layer over the first electrode, and a second electrode over the piezoelectric layer; and
   an active circuit formed on a second portion of said wafer laterally adjacent to the first portion and electrically connected to said piezoelectric resonator, wherein the active circuit includes a frequency divider.

2. The semiconductor device of claim 1 wherein the frequency divider is programmable via a control signal.

3. The semiconductor device of claim 1 wherein the piezoelectric resonator comprises an acoustic reflector.

4. The semiconductor device of claim 3 wherein the acoustic reflector comprises alternating layers of lower and higher acoustic impedance material.

5. The semiconductor device of claim 1 wherein the piezoelectric resonator comprises a pair of acoustic reflectors on opposing sides of the piezoelectric resonator.

6. A semiconductor device, comprising:
   a semiconductor wafer;
   a piezoelectric resonator formed on a first portion of said wafer, the piezoelectric resonator having a first electrode of molybdenum, a piezoelectric layer of AlN over the first electrode, and a second electrode of molybdenum over the piezoelectric layer;
   a first acoustic reflector below the piezoelectric resonator;
   a second acoustic reflector above the piezoelectric resonator, wherein the first and second acoustic reflectors each comprise alternating layers of SiC and a nanoporous spin-on-glass; and
   an active circuit formed on a second portion of said wafer laterally adjacent to the first portion and electrically connected to said piezoelectric resonator.

* * * * *